United States Patent [19]

Voorman

[11] Patent Number: 4,723,110
[45] Date of Patent: Feb. 2, 1988

[54] TRANSCONDUCTANCE AMPLIFIER

[75] Inventor: Johannes O. Voorman, Eindhoven, Netherlands

[73] Assignee: U.S. Philips Corporation, New York, N.Y.

[21] Appl. No.: 15,452

[22] Filed: Feb. 17, 1987

[30] Foreign Application Priority Data

Feb. 20, 1986 [NL] Netherlands ............ 8600422

[51] Int. Cl.$^4$ ............................................. H03F 3/45
[52] U.S. Cl. .................................... 330/252; 330/258
[58] Field of Search ................. 330/69, 252, 258, 261

[56] References Cited

U.S. PATENT DOCUMENTS 4,612,513  9/1986  Seevinck .................. 330/261

Primary Examiner—Eugene R. LaRoche
Assistant Examiner—Steven J. Mottola
Attorney, Agent, or Firm—Robert T. Mayer; Bernard Franzblau

[57] ABSTRACT

A transconductance amplifier comprising a voltage divider including two identical resistors ($R_o$) connected between the bases (3, 4) of two first transistors ($T_{o1}$, $T_{o2}$) arranged as a differential pair, each having a first emitter area ($e_o$). The junction point of said resistors ($R_o$) is connected to the base of a second transistor ($T_1$) having a second emitter area ($2e_1$), whose emitter, like that of the first transistors ($T_{o1}$, $T_{o2}$), is connected to a current source (6). For a ratio between the second and the first emitter areas ($2e_1$; $e_o$) equal to 4:1 the difference between the output currents ($I_1$, $I_3$) of the first transistors ($T_{o1}$, $T_{o2}$) increases as a linear function of the input voltage over a range which is as large as possible.

20 Claims, 14 Drawing Figures

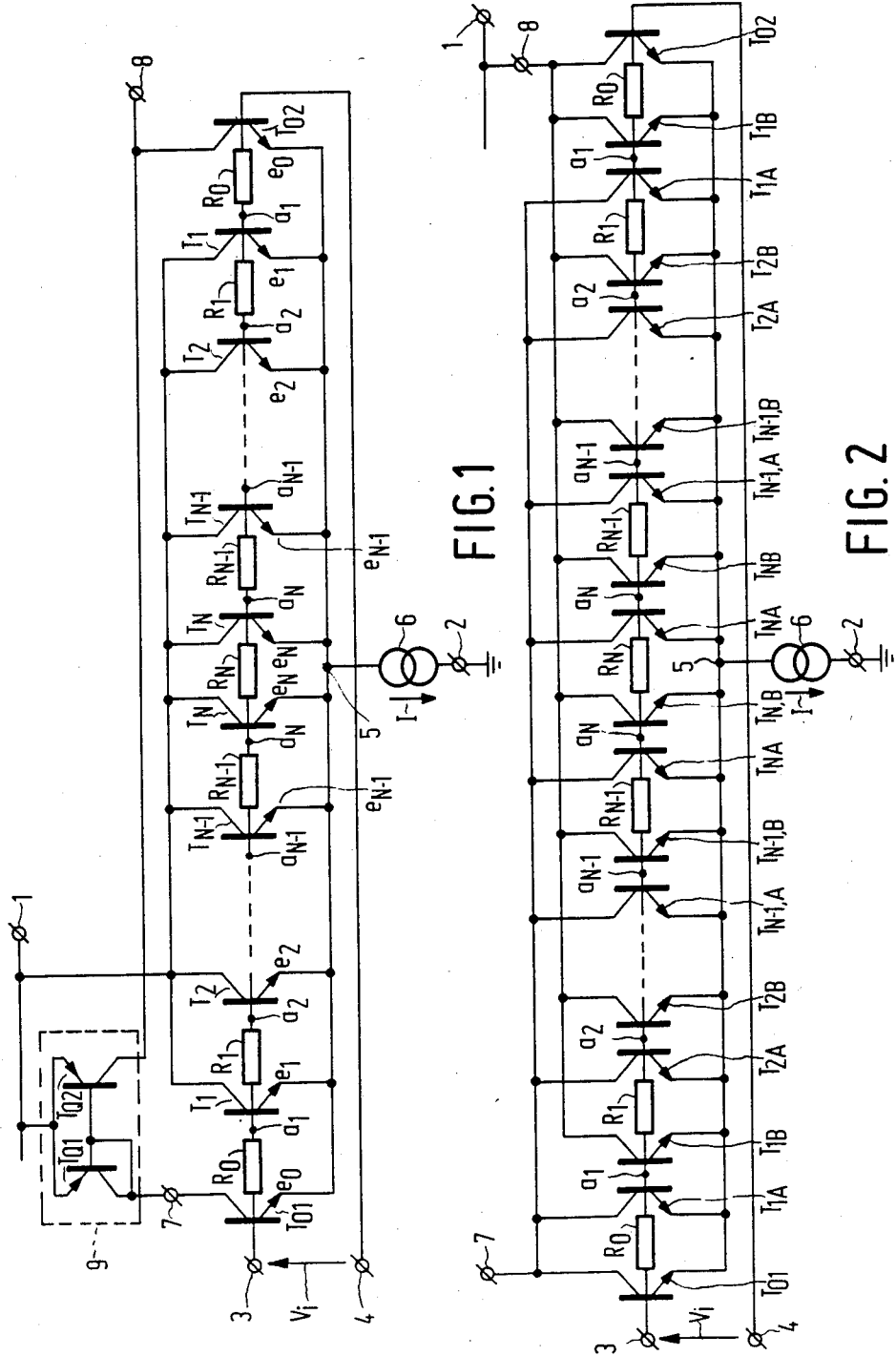

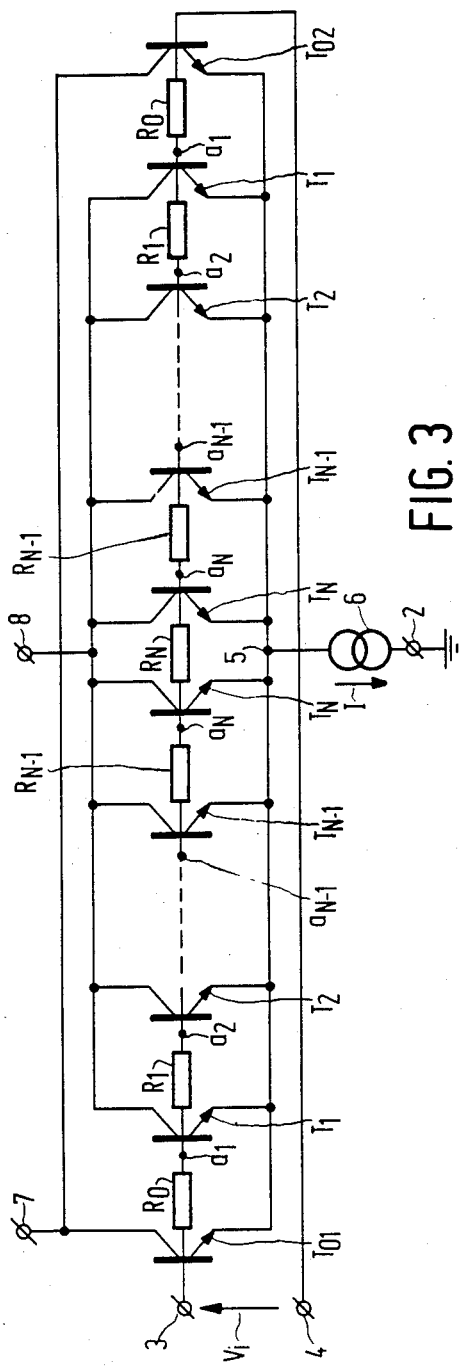
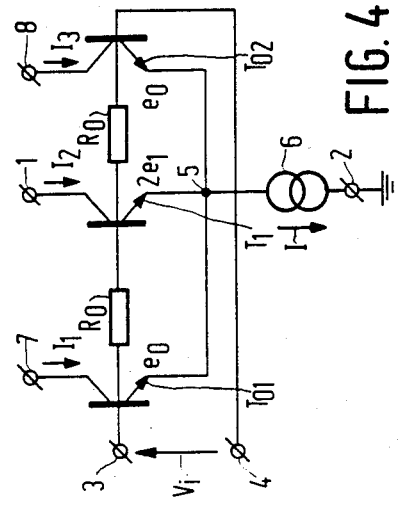
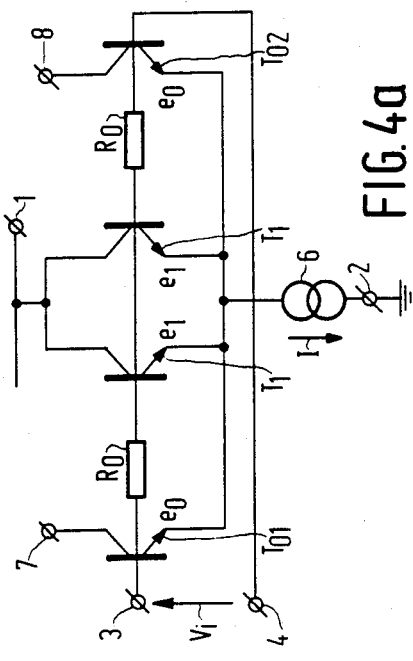
FIG. 3
FIG. 4a
FIG. 4b

TRANSCONDUCTANCE AMPLIFIER

BACKGROUND OF THE INVENTION

The invention relates to a transconductance amplifier comprising two transistors $T_o$ each having an emitter area $e_o$, their bases constituting inputs for receiving an input voltage and their emitters being connected to a current source, and further comprising at least a first output for an output current.

Such transconductance amplifiers, briefly referred to as transconductors, are suitable for general uses and in particular for use in filter circuits, multipliers and oscillators.

A transconductor is a voltage-controlled current source in which the proportionality factor between the output current and the input voltage is given by the transconductance. The simplest transconductor is a differential amplifier, by means of which a voltage applied between the bases is converted into two collector signal currents of opposite phase. In a differential amplifier these signal currents increase as a linear function of the input voltage over a small range only, so that the transconductance is only constant over a very small range of input voltage. The article "Bipolar Integration of analog gyrator and laguerre type filters (transconductor-capacitor filters)" in Proceedings ECCTD'83, September 1983, pages 107–110 describes a linearised transconductor which comprises two parallel-connected differential amplifiers, the transistors of each amplifier having different emitter areas and the bases and the collectors of two transistors having different emitter areas being interconnected. In the case of a suitable choice of the ratio between the emitter areas of the transistors, the linear range of this transconductor is approximately five times as large as that of a single differential amplifier. In addition, this known transconductor may be arranged to form a square-law transconductor, in which the output current increases as a square-law function of the input voltage over a specific range. In this case the collectors of the transistors whose bases are interconnected are not coupled to each other but are cross-coupled to the collector of the corresponding transistor of the other differential amplifier.

SUMMARY OF THE INVENTION

It is an object of the invention to provide a transconductor which makes it possible to obtain both a linear and a square-law transconductor with a larger useful output-voltage range. In accordance with the invention a transconductor of the type defined in the opening paragraph is characterized in that a series arrangement of $2N+1$ impedances $R_o, \ldots, R_{N-1}, R_N, R_{N-1}, \ldots, R_o$ having resistance values $W_k$, where $k = 0, \ldots, N$ is arranged between the bases of the two transistors, and the 2N junction points $a_1, \ldots, a_N, a_N, \ldots, a_1$ between these $2N+1$ resistors are connected to the bases of 2N transistors, $T_1, \ldots, T_N, T_N, \ldots, T_1$ having emitter areas $e_k$, where $k = 1, \ldots, N$.

In a transconductor in accordance with the invention it is possible to obtain an output-voltage range which is at least twice as large as that of the known transconductors for any value of N by a suitable choice of the ratio between the emitter areas of the transistors and the ratio between the resistance values.

The manner in which the collectors of the transistors $T_o$ and $T_1, \ldots, T_N, T_N, \ldots, T_1$ are connected depends on whether the circuit is to be used as a linear transconductor, in which the output current increases, as far as possible, as a linear function of the input voltage, or as a square-law transconductor, in which the output current increases, as far as possible, as a square-law function of the input voltage. In the case of a linear transconductor a distinction should be made between class AB and class A operation of the transconductor. A class AB transconductor is to be understood to mean a transconductor whose bias current increases as the input voltage $V_i$ increases, and a class A transconductor is to be understood to mean a transconductor whose bias current is independent of the input voltage $V_i$.

A class AB linear transconductor in accordance with the invention may be characterized in that the collectors of the transistors $T_1, \ldots, T_N, T_N, \ldots, T_1$ are connected to a power-supply terminal and in that the collectors of the transistors $T_o$ constitute the outputs of the transconductance amplifier. The difference between the collector currents of the transistors $T_o$ then increases as a linear function of the input voltage over a specific range. As a result of the class AB operation of the circuit the bias current is comparatively small for low input voltages. As a result of this the noise level and the d.c. offset at low input voltages are small.

It is to be noted that apparently the construction of such a class AB transconductor for which $N=1$, and the resistance value $W_1 = 0$ bears some resemblance to the differential amplifier shown in FIG. 1 of European Patent Application No. 0157447. In said differential amplifier the bias current also increases as the input voltage increases. However, this step is not aimed at increasing the linear range but at increasing the slew rate, i.e. the maximum rate at which the output signal of the amplifier can vary in the case of capacitive loading. Moreover, the amplifier is a negative-feedback differential amplifier in which the emitters, in contradistinction to the transconductor in accordance with the invention, are not connected directly to the bias-current source but via a resistor. A transconductor in accordance with the invention maintains its linearity over a wide range of bias current, whereas the circuit for increasing the slew rate only operates in a small current range around the value for which the circuit has been designed.

A class A linear transconductor in accordance with the invention may be characterized in that each of the transistors $T_1, \ldots, T_N, T_N, \ldots, T_1$ comprises two parallel-connected transistors, the collector of one transistor being connected to the one transistor $T_o$ and the collector of the other transistor being connected to the other transistor $T_o$ and in that the collector of one of the transistors $T_o$ constitutes a first output of the transconductance amplifier. The output current in each of the collectors of the transistors $T_o$ then varies as a linear function of the input voltage over a specific range, so that each of these collectors may constitute an output of the transconductor.

A square-law transconductor in accordance with the invention may be characterized in that the collectors of the transistors $T_1, \ldots, T_N, T_N, \ldots, T_1$ are connected to a first output of the transconductance amplifier. The output current in the first output then decreases as a square-law function of the input voltage over a specific range. If, in accordance with the further embodiment, the collectors of the transistors $T_o$ are interconnected, these collectors may constitute a second output of the transconductor because the current in this output then increases as a square-law function of the input voltage.

BRIEF DESCRIPTION OF THE DRAWING

Embodiments of the invention will now be described in more detail, by way of example, with reference to the accompanying drawings in which:

FIG. 1 is the circuit diagram of a class AB linear transconductor in accordance with the invention, FIG. 2 shows the circuit diagram of a class A transconductor in accordance with the invention, FIG. 3 is the circuit diagram of a square-law transconductor in accordance with the invention, FIGS. 4a and 4b show a class AB linear transconductor in accordance with a first embodiment.

DESCRIPTION OF THE PREFERRED EMBODIMENTS

Figure 5:
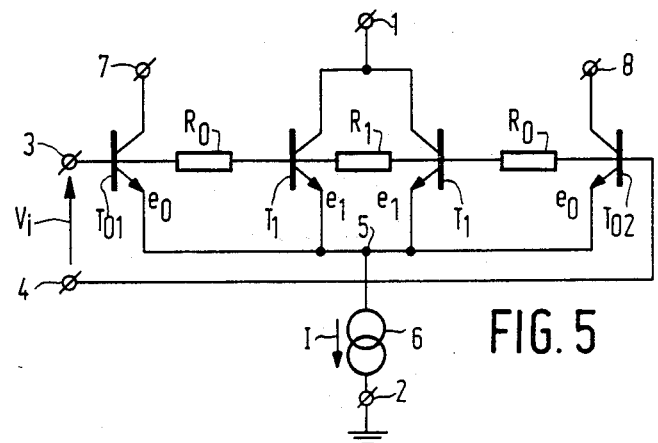
FIG. 5 shows a class AB linear transconductor in accordance with a second embodiment.

FIG. 1 is the circuit diagram of a class-AB linear transconductor in accordance with the invention. Between a first power-supply terminal 1 and a second power-supply terminal 2 the transconductor comprises two transistors $T_{o1}$ and $T_{o2}$ whose bases 3 and 4 constitute the inputs for receiving an input voltage $V_i$ and whose emitters are connected to the output 5 of a current source 6 which can supply a current I. A voltage divider is arranged between the bases 3 and 4 and comprises 2N+1 resistors $R_o, R_1, \ldots, R_{N-1}, R_N, R_{N-1}, \ldots, R_1, R_o$ having resistance values $W_k$, where $k=0, 1, \ldots, N$. The 2N junction points $a_1, \ldots, a_N, a_N, \ldots, a_1$ are connected to bases of the transistors $T_1, \ldots, T_N, T_N, \ldots, T_1$ having emitter areas $e_k$, where $k=1, \ldots, N$. The emitters of these 2N transistors are connected to the output 5 of the current source 6. The collectors of the transistors $T_{o1}$ and $T_{o2}$ constitute the outputs 7 and 8 of the transconductor, while the collectors of the transistors $T_1, \ldots, T_N, T_N, \ldots, T_1$ are connected to the positive power-supply terminal 1. In the quiescent state the transistors $T_1, \ldots, T_N, T_N, \ldots, T_1$ drain a part of the current I from the current source 6 so that the bias current through the transistors $T_{o1}$ and $T_{o2}$ is only a fraction of the current I. As the input voltage $V_i$ increases the transistors $T_1, \ldots, T_N, T_N, \ldots, T_1$ draw an increasingly smaller part of the current I, so that the bias current through one of the transistors $T_{o1}$ and $T_{o2}$ increases. The advantage of a bias current which increases with the input voltage is that for small input voltages $V_i$ there will be less noise and less offset than in the case of a constant bias current. For each value N the ratio between the emitter areas $e_k$, where $k=0, \ldots, N$, of the transistors $T_{o1}, T_1, \ldots, T_N, T_N, \ldots, T_1, T_{o2}$ and the ratio between the resistance values $W_k$ ($k=0, \ldots, N$) of the resistors $R_o, \ldots R_{N-1}, R_N, R_{N-1}, \ldots, R_o$ can be selected in such a way that the difference between the collector currents of the transistors $T_{o1}$ and $T_{o2}$ has a linear relationship with the input voltage $V_i$ over an as large as possible range. This will be explained hereinafter by means of some examples of class AB linear transconductors. The difference between the collector currents of the transistors $T_{o1}$ and $T_{o2}$ can be obtained by means of a differential-to-single-ended converter 9 of arbitrary construction. This converter 9 may comprise, for example, a current mirror, of which the simplest version is shown in the Figure and which comprises a diode-connected PNP transistor $T_{Q1}$ and a PNP transistor $T_{Q2}$ connected in parallel therewith. The difference between the collector currents of the transistors $T_{o1}$ and $T_{o2}$ can then be taken from the output 8.

FIG. 2 shows the circuit diagram of a class A linear transconductor in accordance with the invention. Identical parts bear the same reference numerals as in FIG. 1. The transistors $T_1, \ldots, T_N, T_N, \ldots, T_1$ are now each constructed as two parallel-connected identical transistors $T_{KA}$ and $T_{KB}$ with $K=1, \ldots, N$, the collectors of all the transistors $T_{KA}$ being connected to the collector of the transistor $T_{o1}$ and the collectors of all the transistors $T_{KB}$ being connected to the collector of transistor $T_{o2}$. As a result of these collector connections the d.c. component of the currents on the output 7 and 8 is independent of the input voltage $V_i$, which means that the circuit operates in class A. The ratio between the emitter areas $e_K$, where $K=0, \ldots, N$, of the transistors $T_o, T_1, \ldots, T_N, T_N, \ldots, T_1, T_o$ and the ratio between the resistance values $W_K$, where $K=0, \ldots, N$, of the resistors $R_o, \ldots, R_N$ may be selected in the same way as in the circuit of FIG. 1. In that case the current at the output 7 increases as a linear function of the input voltage $V_i$ and the current at the output 8 decreases as a linear function of the input voltage $V_i$. This will be explained in more detail by means of an example. It has the advantage that both the output 7 and the output 8 may be used directly as the output of the circuit. This makes the circuit very suitable for operation at high frequencies because it is not necessary to use a differential-to-single-ended converter comprising PNP transistors, which generally has less satisfactory high-frequency properties. In the Figure the output current appears on the output 7. The output 8 is connected to the first power-supply terminal 1. However, it is alternatively possible to employ the difference between the currents on the outputs 7 and 8 as the output current of the circuit, which difference can again be obtained by means of a differential-to-single-ended converter.

FIG. 3 shows the circuit diagram of a square-law transconductor in accordance with the invention. Identical parts bear the same reference numerals as in FIG. 1. The collectors of the transistors $T_{o1}$ and $T_{o2}$ are now connected to an output 7 and the collectors of the transistors $T_1, \ldots, T_N, T_N, \ldots, T_1$ are connected to an output 8. For any value of N the ratio between the emitter areas $e_K$, where $K=0, \ldots, N$, of the transistors $T_{o1}, T_1, \ldots, T_N, T_N, \ldots, T_1, T_{o2}$ and the ratio between the resistance values $W_K$ ($K=0, \ldots, N$) of the resistors $R_o, \ldots, R_{N-1}, R_N, R_{N-1}, \ldots, R_o$ can be selected in such a way that the current on each of the outputs 7 and 8 has a square-law relationship to the input voltage $V_i$ over an as large as possible range. Both the output 7 and the output 8 may serve as the output of the circuit, the output which is not used being connected to, for example, the positive power-supply terminal 1. However, it is alternatively possible to employ the difference between the currents on the outputs 7 and 8 as the output current of the circuit, which difference can again be obtained by means of a differential-to-single-ended converter.

FIG. 4a shows a class AB linear transconductor in accordance with a first embodiment, which is the simplest embodiment. This embodiment corresponds to the circuit shown in FIG. 1 if $N=1$, the resistor $R_1$ has a resistance value $W_1=0$ and the two junction points $a_1$ are commoned to form one junction point. Between the bases 3 and 4 of the transistors $T_{o1}$ and $T_{o2}$ a voltage divider comprising two resistors $R_o$ is arranged, the junction point of these transistors being connected to two transistors $T_1$ each having an emitter area $e_i$. In the present embodiment these transistors $T_1$ are suitably commoned to form a single transistor having an emitter area $2e_1$, as is shown in FIG. 4b. If the collector currents of the transistors $T_{o1}$, $T_1$ and $T_{o2}$ are $I_1$, $I_2$ and $I_3$ respectively, the following relationship applies to the circuit shown in FIG. 4b:

$$I_1 + I_2 + I_3 = I \tag{1}$$

When the input voltage is $V_i$ a voltage $V_{i/2}$ appears between the bases of the transistors $T_{o1}$ and $T_1$ and between the bases of the transistors $T_1$ and $T_{o2}$ as a result of the voltage division by the resistors $R_o$. If the ratio between the emitter areas of the transistors $T_1$ and $T_{o1}$ or $T_{o2}$ is $2e_1:e_o=n:1$, it follows from the well-known exponential relationship between the collector current and the base-emitter voltage of a transistor that:

$$\frac{I_1}{I_2/n} = \frac{I_2/n}{I_3} = \exp\left(\frac{V_{iq}}{2KT}\right) \tag{2}$$

If $$\frac{V_{iq}}{2KT} = x$$

it follows from equations (1) and (2) that:

$$\frac{I_1}{I} = \frac{\exp(x)}{(n + \exp(x) + \exp(-x))} \tag{3}$$

and $$\frac{I_3}{I} = \frac{\exp(-x)}{(n + \exp(x) + \exp(-x))} \tag{4}$$

It follows from equations (3) and (4) that the difference between the collector currents of the transistors $T_{o1}$ and $T_{o2}$ is:

$$\frac{I_1 - I_3}{I} = \frac{\exp(x) - \exp(-x)}{(n + \exp(x) + \exp(-x))} \tag{5}$$

Series expansion of the exponential functions yields:

$$\frac{I_1 - I_3}{I} = \frac{dx\left(1 + \frac{x^2}{3!} + \frac{x^4}{5!} + \ldots\right)}{\left(1 + \frac{dx^2}{2!} + \frac{dx^4}{4!} + \ldots\right)} \tag{6}$$

where $$d = \frac{2}{n+2}$$

which may be reduced to $$\frac{I_1 - I_3}{I} = d\left(x + \left(\frac{1}{6} - \frac{d}{2}\right)x^3 + \left(\frac{1}{120} - \frac{d}{8} + \frac{d^2}{4}\right)x^5 + \ldots\right) \tag{7}$$

If $d=\frac{1}{3}$, i.e. for $n=4$, this equation provides maximum linearity. Thus, for an emitter area of the transistor $T_1$ which is $4\times$ as large as that of the transistors $T_{o1}$ and $T_{o2}$ the difference between the collector currents of the transistors $T_{o1}$ and $T_{o2}$ increases as a linear function of the input voltage $V_i$ over an as large as possible range. In the linear range the following approximation is valid:

$$I_1 - I_3 = I \cdot \frac{V_i \cdot q}{6KT} \tag{8}$$

from which it follows that the transconductance $G=(I_1-I_3)/V_i$ is directly proportional to the current I from the current source 6, so that the transconductance can be varied by varying the current I. This renders the circuit particularly suitable for use as a variable resistance $(R=1/G)$ in filter arrangements, enabling the magnitude of the RC time constants to be varied.

For a ratio between the emitter areas $2e_1:e_o=4:1$ the transistors $T_1$ draws $\frac{2}{3}$ of the current I from the current source 6 for small input voltages $V_i$, so that the effective bias current is then equal to $I/3$. At increasing input voltages this bias current increases, which has the advantage that for low input voltages the arrangement exhibits a lower noise level and a lower d.c. offset than the known transductors.

FIG. 5 shows a class AB linear transconductor in accordance with a second embodiment, identical parts bearing the same reference numerals as in FIG. 4a. This embodiment corresponds to the circuit of FIG. 1 in the case where $N=1$ and the resistor $R_1$ has a resistance $W_1 \neq 0$. In comparison with the circuit shown in FIG. 4a a resistor $R_1$ is arranged between the bases of the transistors $T_1$. In a similar way as for the circuit of FIG. 4 it can be found for the circuit shown in FIG. 5 that the difference between the collector currents of the transistors $T_{o1}$ and $T_{o2}$ and the input voltages $V_i$ are in a linear relationship over an as large as possible range, if the ratio between the emitter areas of the transistors $T_1$ and $T_o$ is substantially to $e_1:e_o=5:1$ and the ratio between the resistance values of the resistors $R_1$ and $R_o$ is substantially equal to $W_1:W_o=0:5$. It is to be noted that in order to obtain a ratio containing only integers the resistance ratio may be selected to be $W_1:W_o=2:1$, which results in overcompensation.

Figure 6:
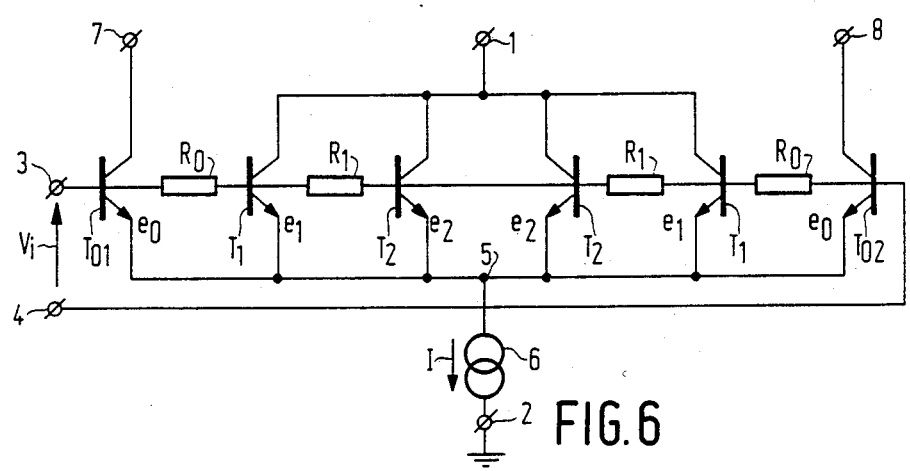
FIG. 6 shows a class AB linear transconductor in accordance with a third embodiment.

FIG. 6 shows a class AB linear transconductor in accordance with a third embodiment. This embodiment corresponds to the arrangement shown in FIG. 1 in the case where $N=2$, the resistor $R_2$ has a resistance value $W_2=0$ and the two junction points $a_2$ are commoned to form a single junction point. For this circuit it is possible to demonstrate that an optimum linear relationship between the output current $I_1-I_3$ and the input voltage $V_i$ is obtained for a ratio between the emitter areas of the transistors $T_2$, $T_1$ and $T_o$ which is substantially equal to $e_2:e_1:e_o=32:49:9$ and for a ratio between the resistance values of the resistors $R_1$ and $R_o$ which is substantially equal to $W_1:W_o=1.9:1$. In the present embodiment the emitter-area ratio and the resistance ratio may be selected to equal $e_2:e_1:e_o=1:6:4$ and $W_1:W_o=2:1$ respectively in order to obtain easy-to-realise ratios. In this embodiment the transistors $T_2$ may be combined to form a single transistor having an emitter area equal to $2e_2$.

Figure 7:
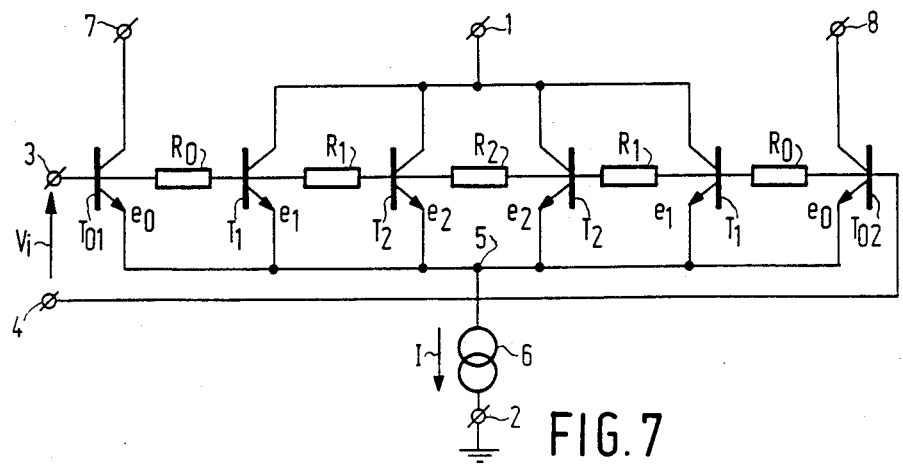
FIG. 7 shows a class AB linear transconductor in accordance with a fourth embodiment.

FIG. 7 shows a class AB linear transconductor in accordance with a fourth embodiment, which corresponds to the arrangement shown in FIG. 1 in the case where $N=2$ and the resistor $R_2$ has a resistance value $W_2$ unequal to zero. In order to obtain an as large as possible range within which the output current $I_1-I_3$ increases as a linear function of the input voltage $V_i$, the emitter areas of the transistors $T_2$, $T_1$ and $T_o$ should be proportioned in such a way that $e_2:e_1:e_o=25:17:3$ and the resistance values of the resistors $R_2$, $R_1$ and $R_o$ should have a ratio which is substantially equal to $W_2:W_1:W_o=2.4:2:1$.

Figure 8:
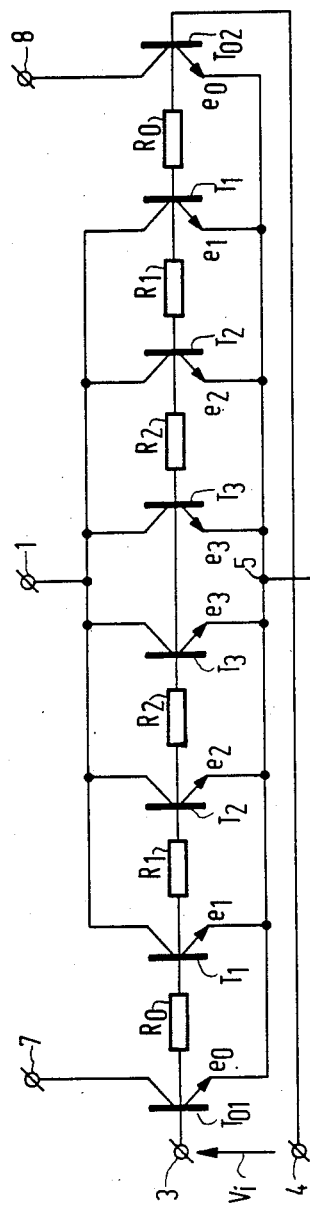
FIG. 8 shows a class AB linear transconductor in accordance with a fifth embodiment.

FIG. 8 shows a class AB linear transconductor in accordance with a fifth embodiment which is identical to the arrangement of FIG. 1 for $N=3$ and a resistance value of the resistor $R_3$ which is $W_3=0$. In the present embodiment the linear range is as large as possible if the ratio between the emitter areas of the transistors $T_3$, $T_2$, $T_1$ and $T_o$ is substantially equal to $e_3:e_2:e_1:e_o=5:9:6:1$ and the ratio between the resistance values of the resistors $R_2$, $R_1$ and $R_o$ is substantially equal to $W_2:W_1:W_o=47:36:17$. In the present embodiment the transistors $T_3$ are preferably also combined to form a single transistor.

The properties of the class AB linear transconductor in accordance with the embodiments shown in FIGS. 4 to 8 are given in the following Table. The Table also gives the properties of a normal differential amplifier and the transconductor in accordance with the aforementioned article in the Proceedings ECCTD'83.

TABLE

| Type of transconductor | $\Delta = 1\%$ (mV) | C.E. (%) | S |
|---|---|---|---|
| Differential amplifier (prior art) | 6 | 6 | I |
| Proc. ECCTD'83 (prior art) | 30 | 40 | I |
| FIG. 4 | 60 | 40 | I/3 |
| FIG. 5 | 142 | 47 | I/6 |
| FIG. 6 | 255 | 51 | I/10 |
| FIG. 7 | 400 | 53 | I/15 |
| FIG. 8 | 575 | 55 | I/21 |

For each transconductor the above Table consecutively gives: the voltage for which the departure from the linear characteristic has increased to 1%; the current efficiency (C.E.) which indicates the fraction of the current I to which the signal current is equal when the 1% linearity deviation is reached, and the effective bias current (S) for low input voltages.

It follows from the Table that the simplest embodiment of the class AB transconductor (FIG. 4) already has a linear voltage range which is 2× as large as that of the known transconductor and a linear voltage range which is 10× larger than that of a normal differential amplifier. This linear range becomes increasingly larger for the consecutive embodiments. The effective bias current S then decreases, which means that the noise level and the d.c. offset are also further reduced.

Figure 9:
FIG. 9 shows a class A linear transconductor in accordance with a first embodiment.

FIG. 9 shows a class A linear amplifier in accordance with a first embodiment, in which Figure identical parts bear the same reference numerals as in FIG. 2. This embodiment corresponds to the arrangement shown in FIG. 2 in the case where $N=1$, the resistor $R_1$ has a resistance value $W_1=0$ and the junction points $a_1$ are commoned to form a single junction point. One transistor $T_1$ then constitutes the transistor $T_{1A}$ whose collector is connected to the collector of the transistor $T_{o1}$ and the other transistor $T_1$ constitutes the transistor $T_{1B}$ whose collector is connected to the collector of the transistor $T_{o2}$. The ratio between the emitter areas of the transistors $T_{1A}$ and $T_{o1}$ and those of $T_{1B}$ and $T_{o2}$ is then $e_1:e_o=2:1$ and is consequently equal to that used in FIG. 4. The fact that the currents on the outputs 7 and 8 then each increase as a linear function of the input voltage can be demonstrated as follows. The difference between the output currents is linear because, as compared with the circuit shown in FIG. 4a, a similar current is added to the currents $I_1$ and $I_3$. Further, the sum of the output currents on the outputs 7 and 8 is equal to the current I from the current source 6, which means that the output currents each should then also increase as a linear function of the input voltage. As a result of this, both the current in output 7 and the current in output 8 can be used directly as the output current of the transconductor. If one of the outputs is employed, the other output may be connected to, for example, the first power-supply terminal. However, it is alternatively possible to employ the difference between the currents on said outputs as the output current of the circuit. The linear range of the arrangement is the same as that of the arrangement shown in FIG. 4. The d.c. component in each of the output currents is constant and is I/2. For small input voltages the noise and the d.c. offset are therefore higher than in the corresponding class AB transconductor shown in FIG. 4.

Figure 10:
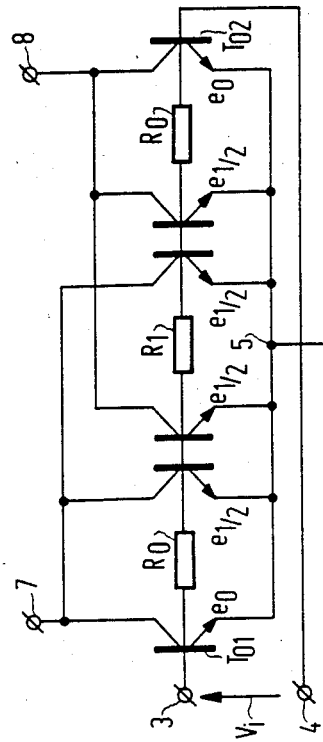
FIG. 10 shows a class A linear transconductor in accordance with a second embodiment.

FIG. 10 shows a class A linear transconductor in accordance with a second embodiment. This arrangement corresponds to the arrangement shown in FIG. 2 in the case where $N=1$ and the resistor $R_1$ has a resistance $W_1$ unequal to zero. Each of the transistors $T_{1A}$ and $T_{1B}$ then has an emitter area equal to half the emitter area of the transistor $T_1$ used in the arrangement shown in FIG. 5.

In the same way as in the class AB transconductors the arrangement shown in FIG. 2 may be constructed as a higher-order class A linear transconductor. The linear range then increases in the same way as specified in the above Table for the class AB transconductors.

Figure 11:
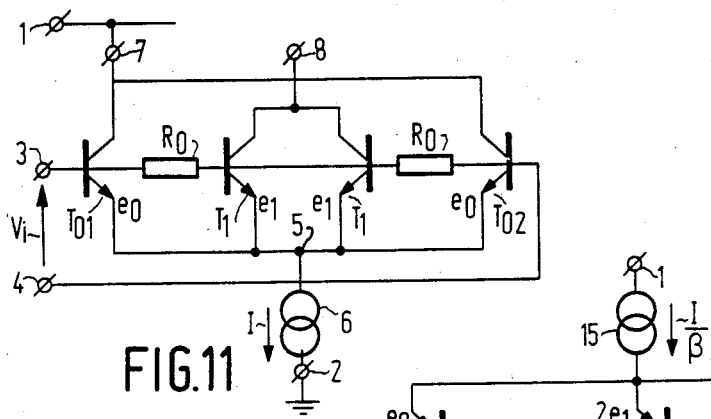
FIG. 11 shows a square-law transconductor.

FIG. 11 shows a square-law transconductor in accordance with a first embodiment, identical parts bearing the same reference numerals as in FIG. 3. This arrangement corresponds to the arrangement shown in FIG. 3 in the case where $N=1$ and the resistor $R_1$ has a resistance $W_1=0$. Suitably, the transistors $T_1$ are combined to form a single transistor having an emitter area $2e_1$. If the collector currents of the transistors $T_{o1}$, $T_1$ and $T_{o2}$ are again $I_1$, $I_2$ and $I_3$ respectively the circuit complies with:

$$I_1 + I_2 + I_3 = I \tag{9}$$

For an input voltage $V_i$ a voltage $V_{i/2}$ will appear between the bases of the transistors $T_{o1}$ and $T_1$ and between the bases of the transistors $T_1$ and $T_{o2}$ as a result of the voltage division by the resistors $R_o$. If the ratio between the emitter areas of the transistors $T_1$ and those of the transistors $T_{o1}$ and $T_{o2}$ is $2e_1:e_o = n:1$, the following is valid:

$$\frac{I_1}{I_2/n} = \frac{I_2/n}{I_3} = \exp\left(\frac{V_i}{2} \cdot \frac{q}{KT}\right) \tag{10}$$

For $$x = \frac{V_i \cdot q}{2KT}$$

it follows from equations (9) and (10) that:

$$\frac{I_2}{I} = \frac{n}{n + \exp(x) + \exp(-x)} \tag{11}$$

By means of a series expansion of the exponential functions it can be demonstrated, in a similar way as for the arrangement shown in FIG. 4b, that the relationship between the output current $I_2$ on output 8 decreases as a square-law function of the input voltage over an as large as possible range if the emitter-area ratio is substantially equal to $2e_o:e_1 = 10:1$. In that case the current $I_1 + I_3$ on the output 7 increases as a square-law function of the input voltage $V_i$. Therefore, not only the current on output 7 but also the current on output 8 may be utilized as the output current of the arrangement. However, it is alternatively possible to take the difference of these currents as the output current. The purely quadratic range of the transconductor is substantially twice as large as that of the known transconductor.

For the embodiments of a square-law transconductor with values of $N > 1$ it is possible, in the same way as for the arrangement shown in FIG. 11, to find a ratio between the emitter areas of the transistors and a resistance ratio for which the square-law range is as large as possible.

Figure 12:
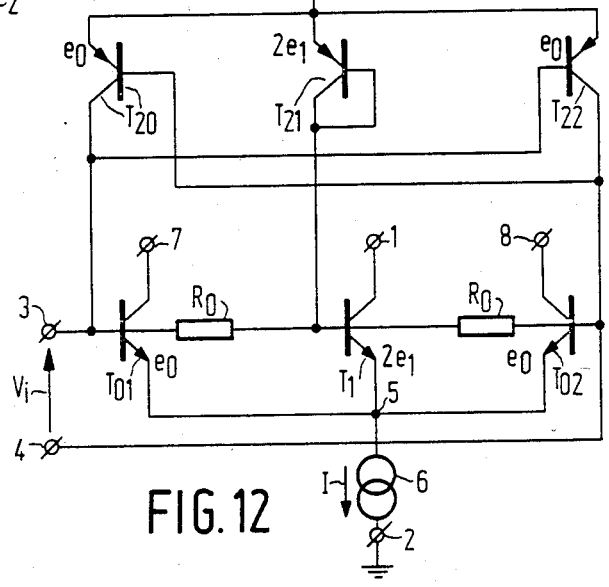
FIG. 12 shows a base-current compensation circuit for a transconductor in accordance with the invention.
Figure 13:
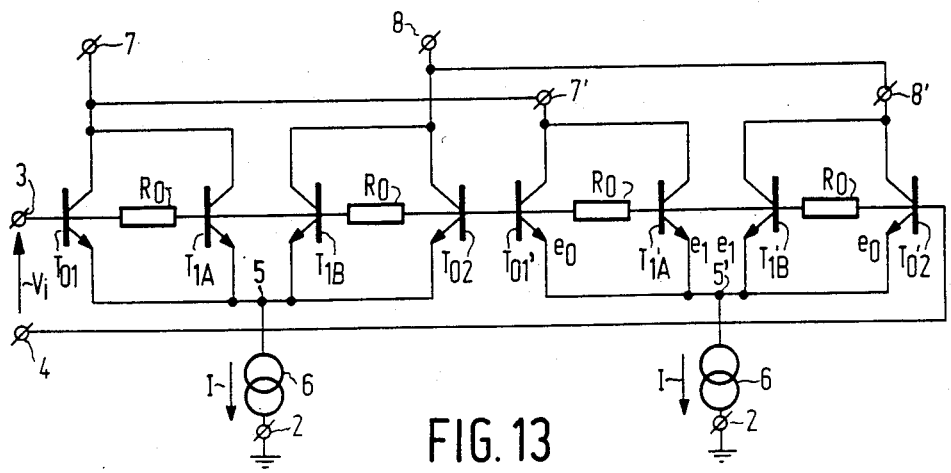
FIG. 13 shows a series arrangement of two transconductors in accordance with the invention.

The invention is not limited to the embodiments described above. Within the scope of the present invention many modifications are obvious to those skilled in the art. For example, the impedances of the voltage dividers in the above embodiments are not limited to pure resistors. In parallel with the resistors it is possible to arrange, for example, capacitors in order to improve the high-frequency behaviour of the arrangements. In addition, the transistors shown in the above embodiments may be driven by buffer transistors. These transistors may be employed in a suitable manner in order to reduce the influence of the base currents of the transistors and hence the voltage drop across the voltage-divider resistors on the operation of the arrangement. Another method of reducing the influence will be described with reference to FIG. 12, which illustrates this possibility for the embodiment shown in FIG. 4b. Identical parts bear the same reference numerals as in FIG. 4b. The base currents for the transistors $T_{o1}$, $T_1$ and $T_{o2}$ are supplied by a current source 15 which can supply a current $I/\beta$, where $\beta$ is the current-gain factor of the transistors $T_{o1}$, $T_1$ and $T_{o2}$. The current $I/\beta$ is applied to a dividing circuit comprising three PNP transistors $T_{20}$, $T_{21}$ and $T_{22}$ having the same emitter-area ratio as the transistors $T_{o1}$, $T_1$ and $T_{o2}$. Consequently, the collector currents of the transistors $T_{20}$, $T_{21}$ and $T_{22}$ are equal to the base currents of the transistors $T_{o1}$, $T_1$ and $T_{o2}$. Further, the input voltage range of the transconductor can be extended by not applying the total input voltage but by applying, via a voltage divider, a fraction of the total input voltage to the inputs of the transconductor. This results in a reduction of the effective transconductance. The effective transconductance can also be reduced by utilising only a part of the output current by means of a current divider. In order to increase the input voltage range it is further possible to arrange two or more transconductors "in series". FIG. 13 illustrates this for the transconductor shown in FIG. 9. Corresponding parts of the second transconductor are primed in this Figure. As a result of the voltage division by the resistors $R_o$ half the input voltage appears between the bases of the transistors $T_{o1}$ and $T_{o2}$ and the bases of the transistors $T_{o1}'$ and $T_{o2}'$, which voltages are converted into output currents of opposite phase by each of the transconductors. The corresponding outputs of the two transconductors are interconnected so that the corresponding output currents are added to each other.

What is claimed is:

1. A transconductance amplifier comprising two transistors $T_o$ each having an emitter area $e_o$, and bases constituting inputs for receiving an input voltage and emitters connected to a current source, and at least a first output for an output current, characterized in that a series arrangement of $2N+1$ impedances $R_o, \ldots, R_{N-1}, R_N, R_{N-1}, \ldots, R_o$ having resistance values $W_k$, where $k = 0, \ldots, N$, is coupled between the bases of the two transistors, and 2N junction points $a_1, \ldots, a_N, a_N, \ldots, a_1$ between the $2N+1$ resistors are connected to the bases of $2N$ transistors, $T_1, \ldots, T_N, T_N, \ldots, T_1$ having emitter areas $e_k$, where $k = 1, \ldots, N$, where N is an integer such that $N \geq 1$.

2. A transconductance amplifier as claimed in claim 1, characterized in that collectors of the transistors $T_1, \ldots, T_N, T_N, \ldots, T_1$ are connected to a power-supply terminal and in that collectors of the transistors $T_o$ constitute the outputs of the transconductance amplifier.

3. A transconductance amplifier as claimed in claim 2, characterized in that for a resistance value $W_N$ of the resistor $R_N$ equal to zero the two junction points $a_N$ form a single junction point $a_N$.

4. A transconductance amplifier as claimed in claim 1, characterized in that each of the transistors $T_1, \ldots, T_N, T_N, \ldots, T_1$ comprise two parallel-connected transistors, the collector of one transistor being connected to the one transistor $T_o$ and the collector of the other transistor being connected to the other transistor $T_o$, and in that the collector of one of the transistors $T_o$ constitutes a first output of the transconductance amplifier.

5. A transconductance amplifier as claimed in claim 4, characterized in that the collector of the other transistor $T_o$ constitutes a second output of the transconductance amplifier.

6. A transconductance amplifier as claimed in claim 4, characterized in that for a resistance value $W_N$ of the resistor $R_N$ equal to zero the two junction points $a_N$ form a single junction point and in that the two transistors $T_N$ are parallel connected to form a compound transistor.

7. A transconductance amplifier as claimed in claim 1, characterized in that the collectors of the transistors $T_1$, ..., $T_N$, $T_N$, ..., $T_1$ are connected to a first output of the transconductance amplifier.

8. A transconductance amplifier as claimed in claim 7, characterized in that the collectors of the transistors $T_o$ are connected to a second output of the transconductance amplifier.

9. A transconductance amplifier as claimed in claim 7, characterized in that for a resistance value $W_N$ of the resistor $R_N$ equal to zero the two junction points $a_N$ form a single junction point $a_N$.

10. A transconductance amplifier as claimed in claim 3, characterized in that for $N=1$ the ratio between the emitter areas of the transistors $T_1$ and $T_o$ is substantially equal to $e_1:e_o=2:1$.

11. A transconductance amplifier as claimed in claim 3, characterized in that for $N=2$ the ratio between the emitter areas of the transistors $T_2$, $T_1$ and $T_o$ is substantially equal to $e_2:e_1:e_o=32:49:9$ and the ratio between the resistance values of the resistors $R_1$ and $R_o$ is substantially equal to $W_1:W_o=1.9:1$.

12. A transconductance amplifier as claimed in claim 3, characterized in that for $N=3$ the ratio between the emitter areas of the transistors $T_3$, $T_2$, $T_1$ and $T_o$ is substantially equal to $e_3:e_2:e_1e_o=5:9:6:1$ and the ratio between the resistance values of the resistors $R_2$, $R_1$ and $R_o$ is substantially equal to $W_2:W_1:W_o=47:36:17$.

13. A transconductance amplifier as claimed in claim 2, characterized in that for $N=1$ the ratio between the emitter areas of the transistors $T_1$ and $T_o$ is substantially equal to $e_1:e_o=5:1$ and the ratio between the resistance values of the resistors $R_1$ and $R_o$ is substantially equal to $W_1:W_o=8:5$.

14. A transconductance amplifier as claimed in claim 2, characterized in that for $N=2$ the ratio between the emitter areas of the transistors $T_2$, $T_1$ and $T_o$ is substantially equal to $e_2:e_1:e_o=25:17:3$ and the ratio between the resistance values of the resistors $R_2$, $R_1$ and $R_o$ is substantially equal to $W_2:W_1:W_o=2.4:2:1$.

15. A transconductance amplifier as claimed in claim 9, characterized in that for $N=1$ the ratio between the emitter areas of the transistors $T_1$ and $T_o$ is substantially equal to $e_o:e_1=5:1$.

16. A transconductance amplifier as claimed in claim 5 wherein for a resistance value $W_N$ of the resistor $R_N$ equal to zero the two junction points $a_N$ form a single junction point and the two transistors $T_N$ are parallel connected to form a compound transistor.

17. A transconductance amplifier as claimed in claim 8 wherein for a resistance value $W_N$ of the resistor $R_N$ equal to zero the two junction points $a_N$ form a single junction point $a_N$.

18. A transconductance amplifier as claimed in claim 6 wherein for $N=1$ the ratio between the emitter areas of the transistors $T_1$ and $T_0$ is substantially equal to $e_1:e_0=2:1$.

19. A transconductance amplifier as claimed in claim 6 wherein for $N=2$ the ratio between the emitter areas of the transistors $T_2$, $T_1$ and $T_0$ is substantially equal to $e_2:e_1:e_0=32:49:9$ and the ratio between the resistance values of the resistors $R_1$ and $R_0$ is substantially equal to $W_1:W_0=1.9:1$.

20. A transconductance amplifier as claimed in claim 6 wherein for $N=3$ the ratio between the emitter areas of the transistors $T_3$, $T_2$, $T_1$ and $T_0$ is substantially equal to $e_3:e_2:e_1:e_0=5:9:6:1$ and the ratio between the resistance values of the resistors $R_2$, $R_1$, and $R_0$ is substantially equal to $W_2:W_1:W_0=47:36:17$.

* * * * *